United States Patent
Oh

(12) 
(10) Patent No.: US 6,496,032 B1
(45) Date of Patent: Dec. 17, 2002

(54) METHOD AND STRUCTURE FOR EFFICIENTLY PLACING AND INTERCONNECTING CIRCUIT BLOCKS IN AN INTEGRATED CIRCUIT

(75) Inventor: Jong-Hoon Oh, Fremont, CA (US)

(73) Assignee: C-Link Technology, Milpitas, CA (US)

( * ) Notice: Subject to any disclaimer, the term of this patent is extended or adjusted under 35 U.S.C. 154(b) by 0 days.

(21) Appl. No.: 09/608,674

(22) Filed: Jun. 29, 2000

Related U.S. Application Data

(60) Provisional application No. 60/142,047, filed on Jul. 2, 1999.

(51) Int. Cl.[7] ............................................. H03K 19/173
(52) U.S. Cl. ........................................ 326/37; 326/101
(58) Field of Search ............................... 326/37–41, 83, 326/86, 101

(56) References Cited

U.S. PATENT DOCUMENTS

| | | | | |
|---|---|---|---|---|
| 5,254,883 A | * | 10/1993 | Horowitz et al. | 326/86 |
| 5,438,281 A | * | 8/1995 | Takahashi et al. | 326/86 |
| 5,821,767 A | * | 10/1998 | Osaka et al. | 326/86 |
| 5,847,577 A | * | 12/1998 | Trimberger | 326/41 |
| RE37,195 E | * | 5/2001 | Kean | 326/41 |
| 6,246,259 B1 | * | 6/2001 | Zaliznyak et al. | 326/83 |

\* cited by examiner

*Primary Examiner*—Don Phu Le
(74) *Attorney, Agent, or Firm*—Townsend and Townsend and Crew LLP

(57) ABSTRACT

In accordance with an embodiment of the present invention, an integrated circuit includes an input bus configured to receive a plurality of input signals. The input bus extends across a predetermined length of one side of the integrated circuit. The integrated circuit further includes a plurality of logic block circuits coupled to the input bus for receiving one or more of the input signals. Each of the logic block circuits are coupled to at least one of a plurality of destination blocks via a first set of interconnect buses. The logic block circuits are placed along the one side of the die such that the first set of interconnect buses extend substantially orthogonal to the input bus.

43 Claims, 7 Drawing Sheets

METHOD AND STRUCTURE FOR EFFICIENTLY PLACING AND INTERCONNECTING CIRCUIT BLOCKS IN AN INTEGRATED CIRCUIT

CROSS-REFERENCES TO RELATED APPLICATIONS

This application takes priority from provisional application No. 60/142047 filed Jul. 2, 1999.

BACKGROUND OF THE INVENTION

The present invention relates to placing circuit blocks and routing interconnect bus lines on an integrated circuit in such a way as to reduce the die area and cost of the integrated circuit.

In many integrated circuits, such as DRAMs (Dynamic Random Access Memories) and SDRAMs (Synchronous DRAMs), there are many large logic blocks, such as input/output ports and row and column decoders, which send and receive electrical signals from each other. These signals are sent along highly conductive interconnect lines such as aluminum or copper interconnect. Alternately, polysilicon can be used. When several of these wires are routed together, the resulting structure is known as a bus. These buses can broadly be broken down into two types, global and local. Global buses run a comparatively long distance around the integrated circuit, connecting two or more logic blocks electrically. Local buses run to neighboring or adjacent logic blocks.

Global buses have a more detrimental impact on an integrated circuit's die size and performance than do local buses. First of all, global buses are longer in length, and therefore, for a given width, take up more surface area on the integrated circuit. Second of all, logic is generally layed out in rows of gates, with routing channels for wires above and below the rows of gates. This is true whether the logic is layed out in the form of a gate array, hand crafted logic, or done by a program such as an auto place and router. Global buses generally use these routing channels, meaning the channels need to be wider.

Also, since global buses are longer in length than local buses, the amount of parasitic capacitance between each line in the bus to the substrate, active areas, power lines and the like, is increased. Furthermore, the fringing capacitance between lines in the bus increases with line length. In general, larger devices are required to drive this extra capacitance, resulting in a larger die size and higher power consumption. Also, the MTBF (Mean Time Between Failure) for an integrated circuit decreases with the increasing temperature that comes with increasing power dissipation. Therefore, long term reliability is also reduced by an increase in the amount of global buses on an integrated circuit.

Table 1 is a command decoder functional truth table of a Synchronous DRAM integrated circuit. Signal levels at inputs $\overline{CS}$ (Chip Select), $\overline{RAS}$ (Row Address Strobe), $\overline{CAS}$ (Column Address Strobe), $\overline{WE}$ (Write Enable), and DSF (Define Special Function), are decoded on the integrated circuit into command signals such as LMR (Load Mode Register), LSMR (Load Special Mode Register), and the other entries in column 100.

FIG. 1 shows a conventional command decoder logic block 110 for performing such decoding. Input signals on signal lines $\overline{CS}$ 120, $\overline{RAS}$ 121, $\overline{CAS}$ 122, $\overline{WE}$ 123, and DSF 124 are typically carried on signal lines coupled to input pads on the integrated circuit. These input signals are decoded into command signals and output on output command signal lines LMR 130, LSMR 131, RBA 132, RBAWPB 133, CBA 134, CBA_AP 135, BW(_AP) 136, BST 137, PCH 139, PCH_ALL 139, and AREF 140. The input signal lines can be collectively referred to as input signal bus 150. The output command signal lines can collectively be referred to as output command signal bus 160.

Table 2 shows the assignment for each of the bank address bits BA<1:0>, and address bits A<8:0> in different command modes. For example, in the Load Mode Register state, the bits on A0 to A3 define the Burst Length for the device. Upon activating the Load Mode Register Command, specific address information is loaded into the command register, thus defining the SDRAM operation with respect to data bursting.

FIG. 2 shows a conventional block and routing placement for an SDRAM integrated circuit 200. Integrated circuit 200 contains a plurality of input pads 210–220, which are coupled to the group of logic blocks 230 by interconnecting wires 240–250. Each pad 210–220 corresponds to one of the address inputs A<8:0> or BA<1:0>. The group of logic blocks 230 is coupled to destination blocks including the I/O (input/output) ports 255, the X-decoder 260, Y-decoders 270 and 271, and mode registers 275 and 276, by global buses 280–285. Command decoder logic block (CDLB) 110 has input signal bus 150 as its inputs, and generates output command signal bus 160 as its output as described in FIG. 1. Output command signal bus 160 couples to the group of logic blocks 230. Some of the lines in output command signal bus 160 may also couple to the destination blocks; these lines are not shown for simplicity. This block and routing placement may be done by hand editing, autorouting, cell generation tools and the like. This type of placement has several global buses and lines routed around the area between the pads and the y-decoders. For example, global buses 280, 281, 282, 283, 284, and 285 respectively couple the group of logic blocks 230 with the I/O ports 255, the y-decoder 271, the mode register 276, the x decoder 260, the mode register 275, and the y-decoder 270. The global buses 280–285 along with interconnect line 240–250 consume die area. For example, the group of logic blocks 230 can only be so close to the pads 210–220 as to allow for room for wires 240–250 to be run. Also, the y-decoders 270 and 271 and group of logic blocks 230 must be far enough apart to allow room for global buses 280–285.

As the above makes clear, there is a great motive to reduce the amount and the length of busing on an integrated circuit.

SUMMARY OF THE INVENTION

In accordance with an embodiment of the present invention, an integrated circuit includes an input bus configured to receive a plurality of input signals. The input bus extends across a predetermined length of one side of the integrated circuit. The integrated circuit further includes a plurality of logic block circuits coupled to the input bus for receiving one or more of the input signals. Each of the logic block circuits are coupled to at least one of a plurality of destination blocks via a first set of interconnect buses. The logic block circuits are placed along the one side of the die such that the first set of interconnect buses extend substantially orthogonal to the input bus.

In another embodiment, the integrated circuit further includes a plurality of input buffers coupled to the input bus for providing the input signals on the input bus. A second set of interconnect buses couple the input buffers to the input bus, and a third set of interconnect buses couple the input bus to the logic block circuits. The second and third sets of interconnect buses extend substantially orthogonal to the input bus.

In another embodiment, the input buffers include a latch circuit for latching the input signals. The input buffers provide the latched input signals on the input bus synchronously with a clock signal.

In another embodiment, the input bus extends across a substantial portion of the length of one side of the integrated circuit.

In accordance with another embodiment of the present invention, a method for placing and routing circuit blocks in an integrated circuit includes the following steps: placing a plurality of destination circuit blocks in predesignated areas of the integrated circuit; extending an input bus across one side of the integrated circuit; placing a plurality of logic block circuits coupled to the input bus along the one side of the integrated circuit such that a first set of interconnect buses coupling the logic circuit blocks to the destination circuit blocks extend substantially orthogonal to the input bus.

In another embodiment, the method further includes the step of placing a plurality of input buffers along the one side of the integrated circuit such that a second set of interconnect buses coupling the input buffers to the input bus extend substantially orthogonal to the input bus.

In another embodiment, the method further includes: duplicating a first one of the logic circuit blocks; coupling the first one of the logic circuit blocks via a fourth interconnect bus to a first one of the destination circuit blocks; coupling the duplicated logic circuit block via a fifth interconnect bus to a second one of the destination circuit blocks; and placing the duplicated logic circuit block and the first one of the logic circuit blocks along the one side of the integrated circuit such that the fourth and fifth interconnect buses extend substantially orthogonal to the input bus.

The following detailed description and the accompanying drawing provide a better understanding of the nature and advantages of the present invention.

BRIEF DESCRIPTION OF THE DRAWINGS

Table 1 shows a command decoder functional truth table.

Table 2 shows the definition of the address inputs during various commands.

DESCRIPTION OF THE SPECIFIC EMBODIMENTS

In accordance with an embodiment of the present invention, a latched address signal generated by a number of address buffers is provided on an address bus extending a predetermined length of the integrated circuit. Each of a plurality of logic blocks receives one or more of the latched address signals through a tristate device controlled by a control signal. The plurality of logic blocks and their associated tristate devices are optimally placed along the address bus so as to minimize the length of buses which connect output terminals of the logic blocks to destination blocks.

Figure 3:
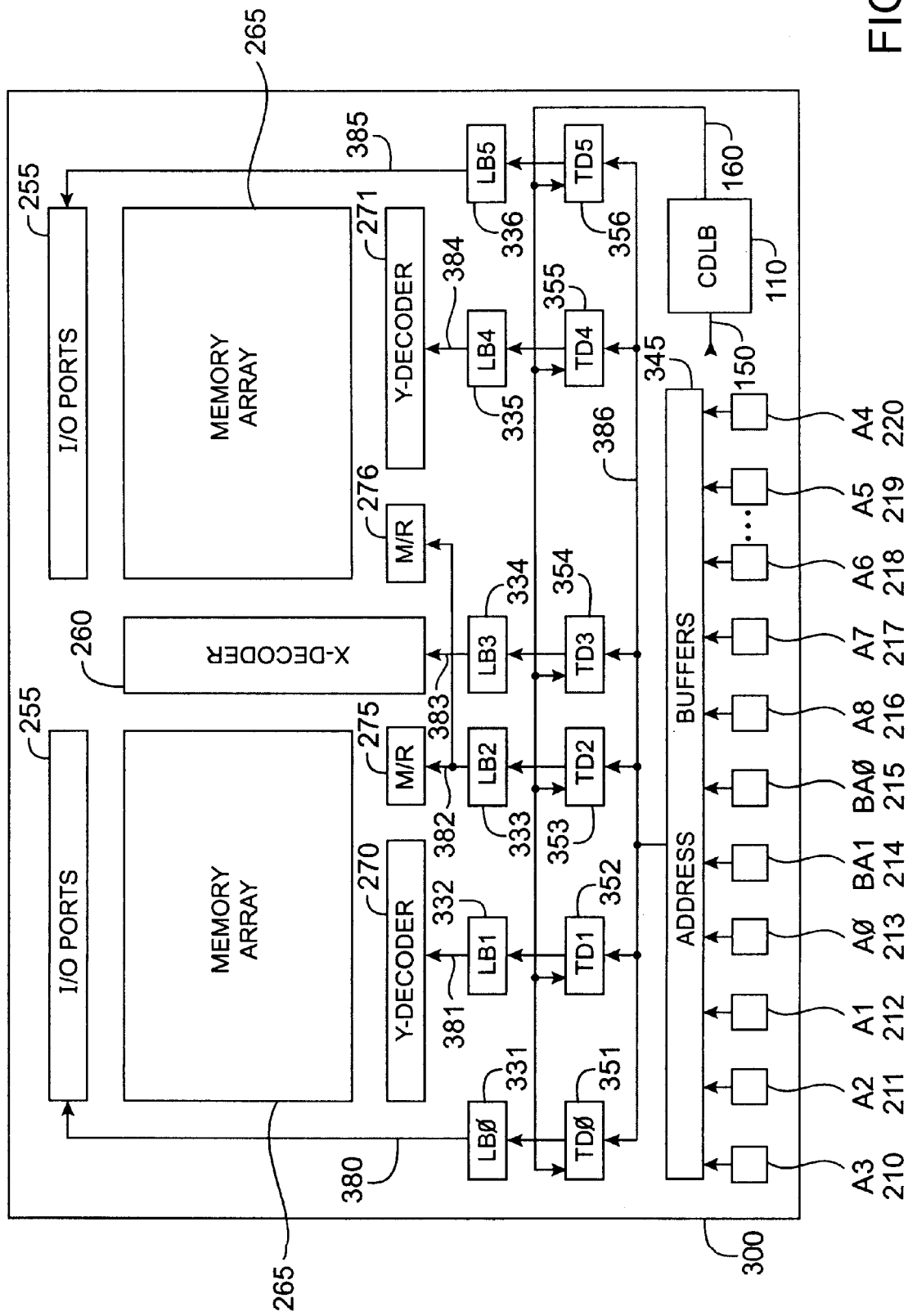
FIG. 3 shows a block and routing placement in accordance with one embodiment of the present invention.

FIG. 3 shows one embodiment of the present invention. An integrated circuit 300 contains a plurality of address pads 210–220, coupled to address buffers 345. Address buffers 345 in turn couple to address bus 386, which couples to tristate devices 351–356. As shown, address bus 386 extends across a substantial portion of one side of integrated circuit 300. The tristate devices 351–356 may be pass gates, and the like. These tristate devices are in substantially close proximity to and coupled to logic blocks 331–336. Logic blocks 331–336 collectively perform essentially the same functions as the group of logic blocks 230, but are divided down, and in this example, spread out along one side of the integrated circuit. The logic blocks 331–336 are optimally positioned along one side of the integrated circuit such that the interconnect between each logic block and its corresponding destination block runs a minimal distance along that same side of the integrated circuit. Command decoder logic block 110 has an input bus 150 and a command output bus 160 which couples to the tristate devices. Command decoder logic block 110 controls which of the tristate devices are on, thus coupling the corresponding latched address signals to the logic blocks 331–336.

The logic blocks 331–336 connect to distant destination blocks such as the I/O ports 255 through global bus lines 380 and 385. Some logic blocks, such as 332–335 connect to destination blocks which are in close proximity, such as the x and y decoders with short global or local buses 381–384. In this example, global buses 280–285 in FIG. 2 have been replaced by shorter global line 382 and the address bus 386. Parallel running lines are eliminated. Therefore, this reduction in bus route paths will help reduce the die size.

Figure 1:
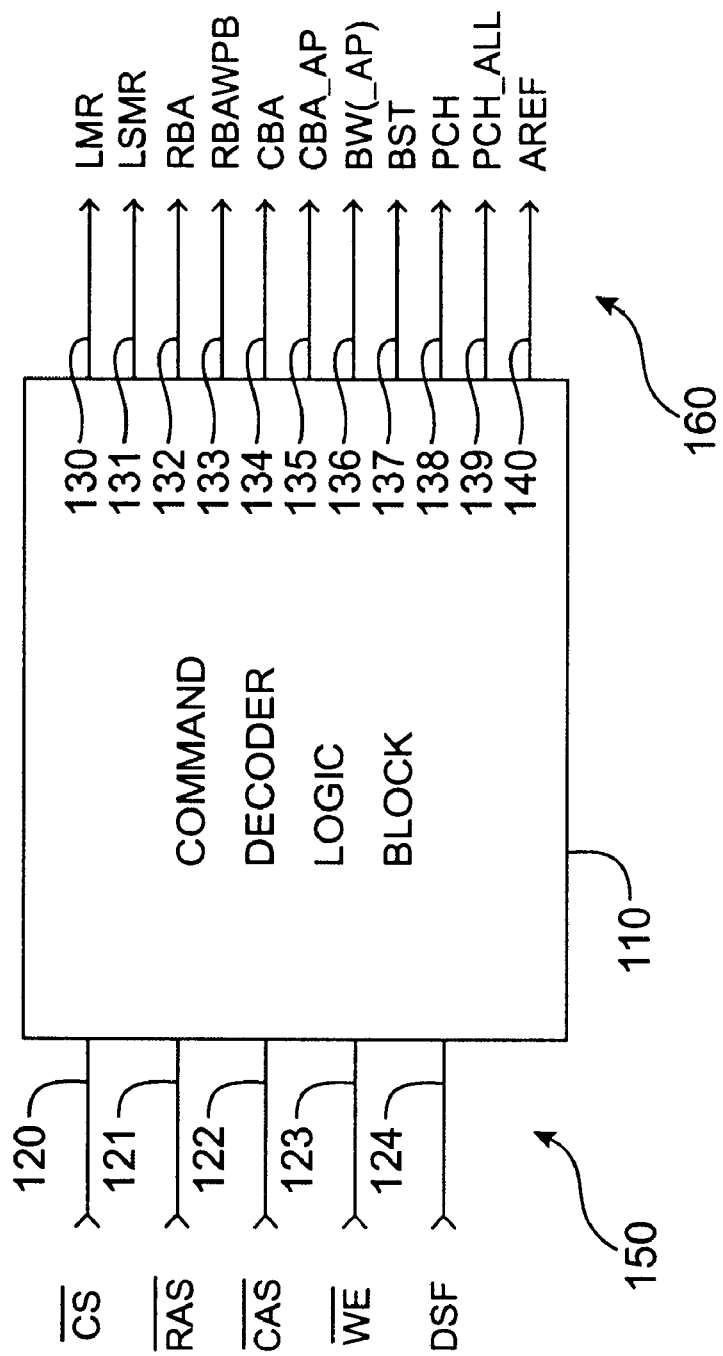
FIG. 1 shows a command decoder logic block.
Figure 2:
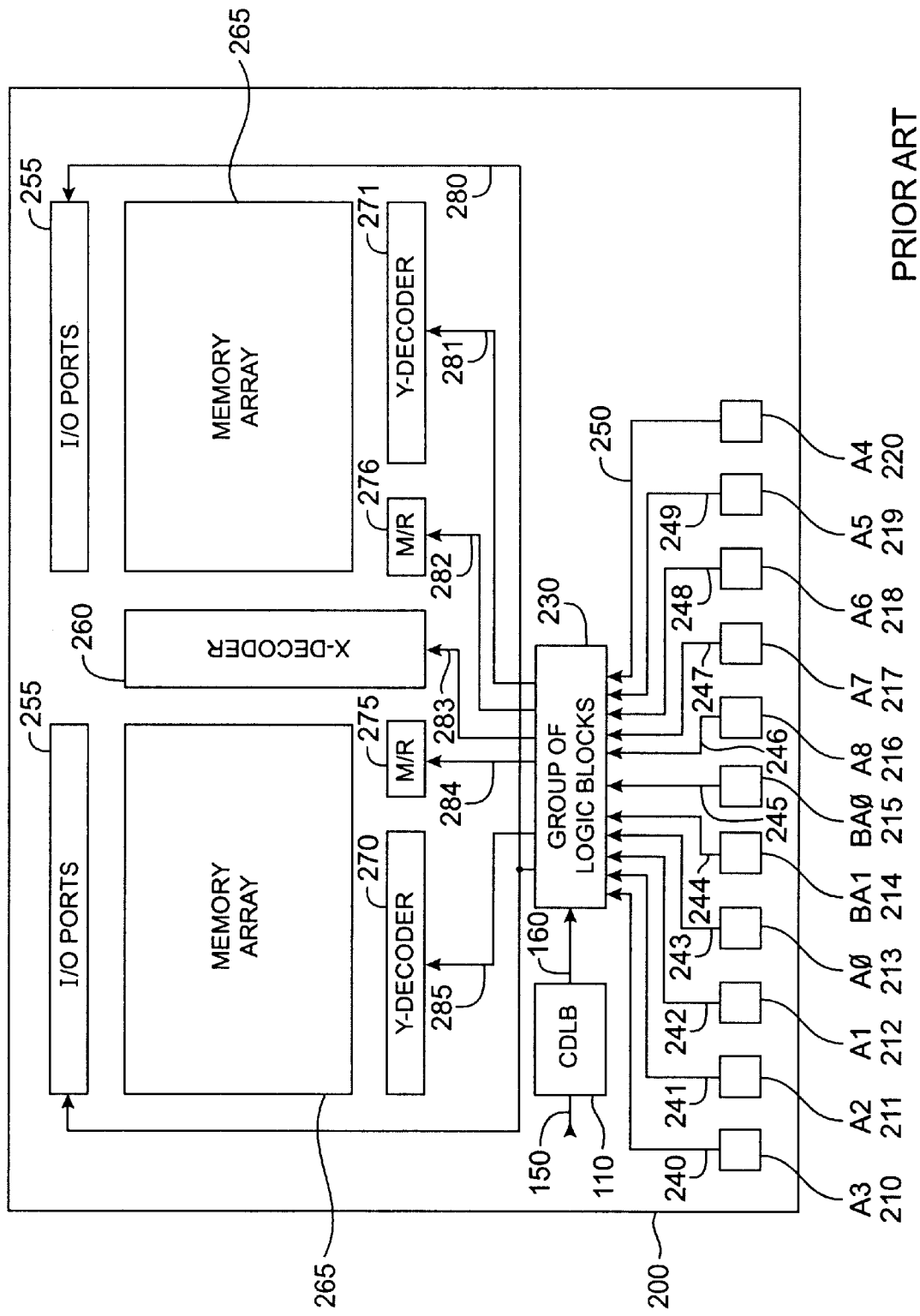
FIG. 2 shows a conventional block and routing placement for an SDRAM in the prior art.

FIG. 3 also shows another feature of the present invention. The horizontal section of bus 280 in FIG. 2 is eliminated by placing a separate but identical set of tristate device and logic block at each end of one side of integrated circuit 300, (i.e. TD5 and LB5 on the right side, and TD0 and LB0 on the left side) where the vertical buses 380 and 385 originate. In doing so, other than reducing the die size by eliminating the horizontal section of bus 280 in FIG. 2, shorter buses 380 and 385 deliver the latched addresses to I/O ports 255. This is made possible by making all latched address signals available across one side of the integrated circuit via bus 386, thus allowing optimal placement and duplication of circuits receiving the latched address signals with minimal die size penalty.

Figure 4:
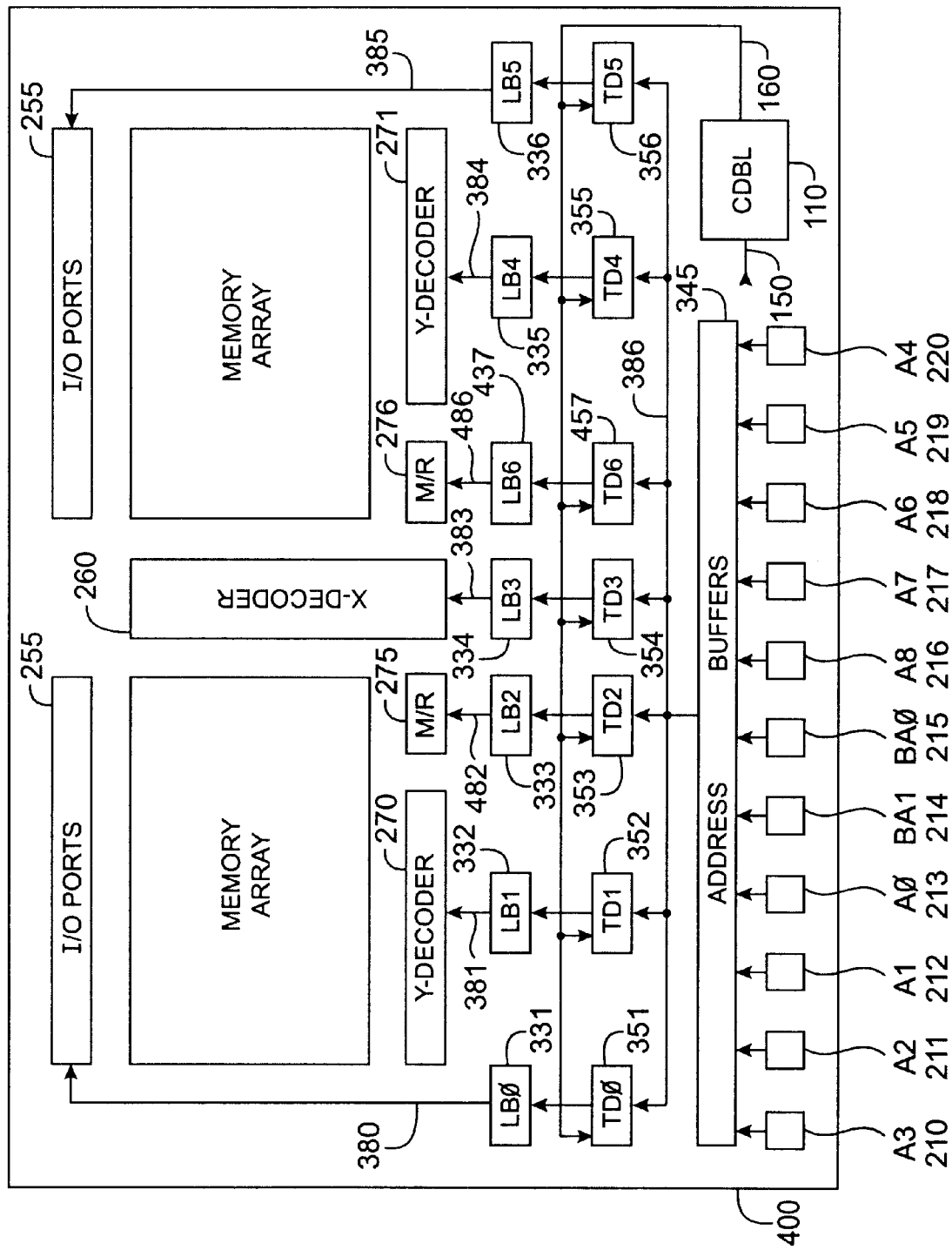
FIG. 4 shows a block and routing placement in accordance with another embodiment of the present invention.

FIG. 4 shows another example wherein interconnect bussing is reduced by taking advantage of the availability of the latched address signals across one side of the integrated circuit. FIG. 4 shows an integrated circuit 400 which is similar to integrated circuit 300 of FIG. 3 except for the addition of tristate device 457 and logic block 437. Tristate device 457 couples the appropriate latched address signals on bus 386 to logic block 437 when CDLB block 110 enables tristate device 457. Logic block 437 couples to mode register block 276 through local bus 486. Logic block 437 is a duplicate, or is very similar to logic block 333 which couples to the other mode register block 275 through local bus 482. By providing mode register 276 its own tristate device 457 and logic block 437, which locally connect to latched address bus 386, the horizontal section of bus 382 in FIG. 3 is eliminated.

FIGS. 3 and 4 are merely examples illustrating the interconnect routing reduction that can be achieved by extending the frequently used latched address bus 386 across a portion of the integrated circuit. It would be obvious to those skilled in this art that this approach may be extended to other signals, such as control signals with multiple destinations at different locations.

Figure 5A:
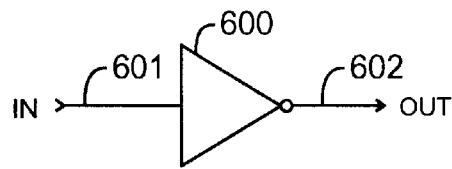
FIGS. 5a to 5e show various embodiments for the circuitry used in the address buffers.

FIGS. 5a through 5e show various embodiments of an address buffer used in the address buffers block 345 of FIGS. 3 and 4. FIG. 5a shows a common inverter 600, which may be used for buffering electrical signals between pads 210–220 and the address bus 386. An input terminal 601 couples to the pads 210–220, and an output terminal 602 couples to the address bus 386. There need to be as many inverters as there are bits of address information.

Figure 5B:
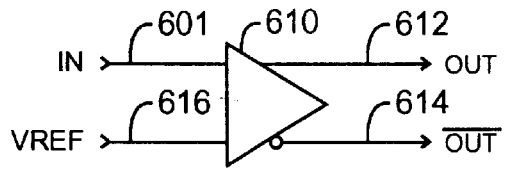
Figure 5C:
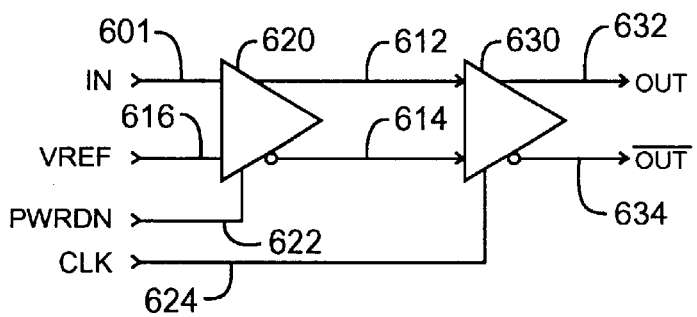

FIG. 5b shows an address buffer 610 whose threshold is controlled by a voltage supplied to the terminal Vref 616. This device has non-inverting output terminal 612 as well as inverting output terminal 614. FIG. 5c shows another address buffer where a two stage approach is used. The first stage 620 is static and acts as a buffer with noninverting output terminal 612 as well as inverting output terminal 614. The first stage can also power down under the control of the signal on the PWRDN terminal 622. This helps keep transient voltages, and therefore power dissipation, to a minimum when the integrated circuit is not required to be operating, but still has power at the supplies. The second stage is dynamic, and is clocked by the signal on the CLK terminal 624. The signal on the output terminal of the second stage will not change unless enabled by a high voltage on the CLK terminal 624. The second stage also has inverting output terminal 634, as well as non-inverting output terminal 632.

Figure 5D:
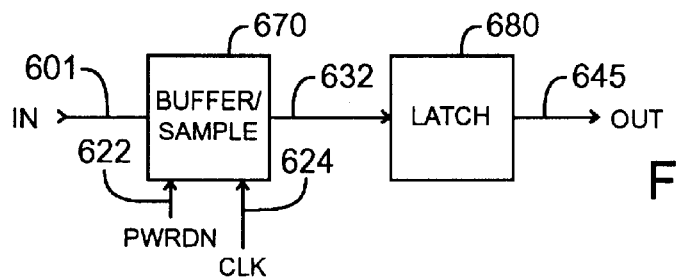

FIG. 5d is a latched input buffer. Buffer/Sample block 670 has input terminal 601 which is coupled to an input pad 210–220. The Buffer/Sample block can be powered down by the signal on the PWRND terminal 622. Signal level changes on pads 210–220 will lead to signal level changes on output terminal 632 at rising edges of the signal on the CLK terminal 624. The output terminal 632 is the input to latch 680, which has output terminal 645. The latch will retain data on output terminal 632 between CLK rising edges.

Figure 5E:
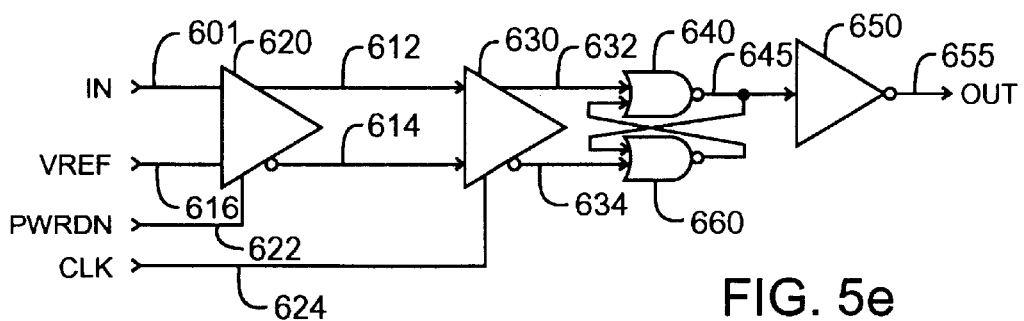

FIG. 5e shows one example of a circuit implementation of the FIG. 5d address buffer. The first stage 620 and second stage 630 are similar to those shown in FIG. 5c, and correspond to the Buffer/Sample block 670 of FIG. 5d. NOR gate 640 and 660 form a cross coupled latch, and along with receiver 650, correspond to the latch block of FIG. 5d. The non-inverting output terminal 632 of the dynamic buffer 630 is coupled to an input terminal of NOR gate 640. The inverting output terminal 634 of the dynamic buffer 630 is coupled to an input terminal of NOR gate 660. The output terminals of each NOR gate cross couple back to the second input terminal of the other NOR gate. The output terminal of NOR gate 640 is coupled to an input terminal of buffer inverter 650 which drives a signal onto a line 655 in the address bus 386 in FIGS. 3 and 4. The input buffer of FIG. 5e operates as follows: assuming the signal on the inverting output terminal 634 of the dynamic buffer 630 is low, the signal on the non-inverting output terminal 632 is thus a high. The latch is stable, providing a low signal on output terminal 645. The inverter 650 buffers and inverts the signal on the output terminal of the NOR gate 640, and provides a high signal for that bit on the address bus. The latch will stay in this configuration until the dynamic stage of the input buffer changes polarities, and the signal on the CLK terminal makes a low to high transition. In that case, the signal on inverting output terminal 634 changes to a high, and the signal on non-inverting output terminal 632 becomes a low. As a result, the signal on output terminal 645 of the latch changes to a high. This signal is buffered and inverted by inverter 650, and a low is thus provided on the address bus.

FIGS. 5a–5e are merely illustrative examples of address buffers which can be used in the ADDRESS BUFFERS block 345 of FIGS. 3 and 4. Other commonly used address buffers, latched or otherwise, may also be used.

Figure 6:
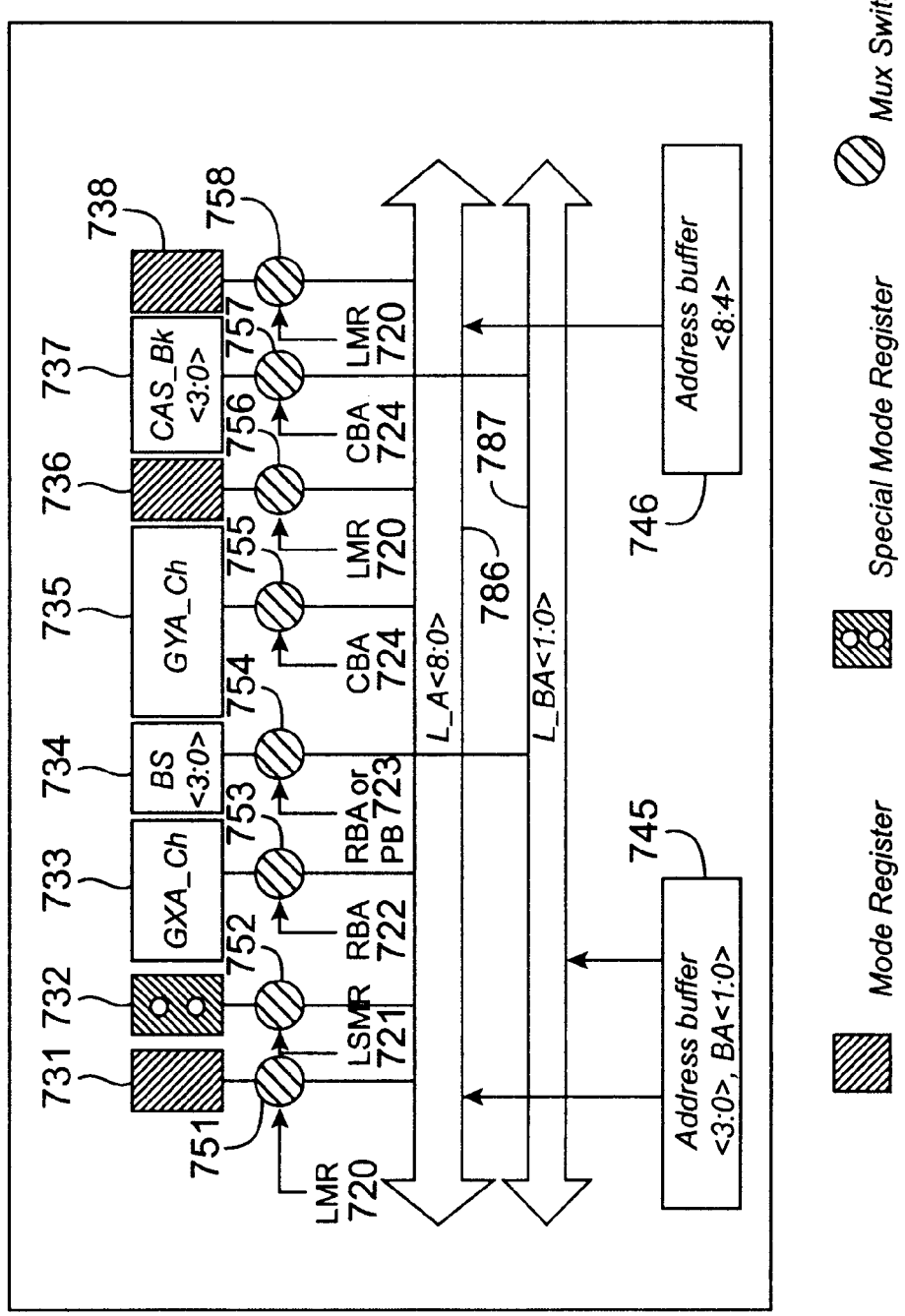
FIG. 6 shows a floor plan for an embodiment of the present invention.

FIG. 6 is a simplified floor plan for the address buffers, latched address bus, tristate devices, and logic blocks for a synchronous DRAM integrated circuit in accordance with one embodiment of the present invention. Address signals A<8:0> and bank address signals BA<1:0> are latched into address buffers 745 and 746, and sent to latched address buses L_A(8:0) and L_BA(1:0) labeled as 786 and 787 respectively. The address buses 786 and 787 extend along one side of the integrated circuit. Tristate devices 751–758 are coupled to latched address uses 786 and 787, and receive control signals on control lines LMR 720, LSMR 721, RBA 722, and CBA 724. The tristate devices then drive the logic blocs GXA_Ch 733, BS(3:0) 734, GYA_Ch 735, CAS_bk(3:0) 737, the Mode Registers 731, 736, and 738, and Special Mode Register 732. The actual layout can follow this floor plan which results in a highly organized, easy to route, and low die area addressing scheme with a minimum of bus wiring and wasted routing space.

The address buses 786 and 787 run along one side of the integrated circuit, in this example the lower horizontal side. Logic blocks 731–738 are aligned with their respective destination blocks (not shown) in the vertical direction. Tristate devices 751–758 are placed in substantially close proximity to the logic blocks to which they are coupled. Command signals 720–724 couple to the tristate devices 751–758 for controlling the tristate devices. The address buses 786 and 787 are coupled to the tristate devices 751–758. In this way the buses running in the horizontal direction is reduced to just the address buses. By vertically aligning the logic blocks with the destination blocks to which they are coupled, vertically running buses are not longer than is required to reach the destination blocks.

The mode registers are programmed with such information as Burst length, CAS latency, and Burst type. The register is divided or copied a number of times depending on the location of the destination blocks receiving each of these signals across a peripheral block. This minimizes global busing. For example, each I/O port burst receives length and CAS latency as well as other information from the mode register. By placing an identical copy of the relevant portions of the mode register at each end of the peripheral region, a set of horizontally running buses are eliminated. As another example, the RBA command signal allows latched BA<1:0> and row addresses A<8:0> to be provided to the x-decoder via GXA Channel. The latched address busing of the present invention allows placement of the RBA tristate device and associated circuitry where the addresses are bused the shortest distance.

Figure 7:
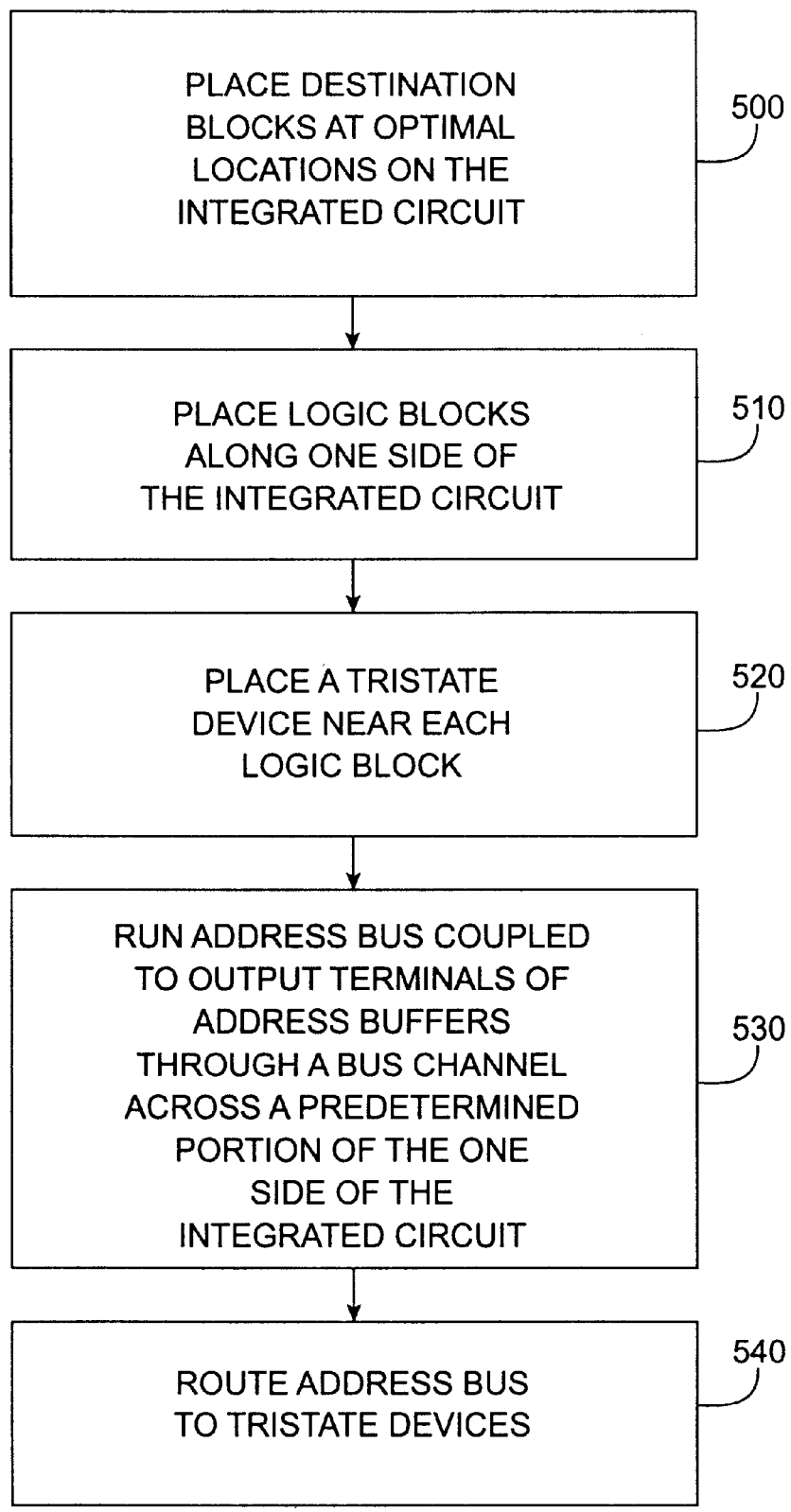
FIG. 7 is a flow chart showing a method for the block and routing placement in accordance with one embodiment of the present invention.

FIG. 7 is a flow chart of a layout method in accordance with one embodiment of the present invention. First, destination blocks are placed at optimal locations on the integrated circuit in step 500. For example, in an SDRAM, the Input/Output ports, and the x and y-decoders will generally have specific locations where the logic flow and operation of the integrated circuit is optimized. Logic blocks (e.g., blocks 331–336 in FIGS. 3 and 4) which send or receive signals to or from the destination blocks are then optimally placed along one side of the integrated circuit in step 510. Tristate devices are placed near the logic blocks in step 520. An address bus coupled to address buffers is routed through a bus channel across a predetermined portion of the same side of the integrated circuit in step 530. The address bus is then coupled to the tristate devices in step 540. It is important to note that these steps may be preformed in any order without deviating from the present invention. For example, the address bus may be routed along one side of the integrated circuit, and then connected to logic blocks through tristate devices which are placed later. In another embodiment, the address bus is a latched address bus.

While the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. An integrated circuit comprising:
   an input bus configured to receive a plurality of input signals, the input bus extending a predetermined length of one side of the integrated circuit;
   a plurality of destination circuit blocks;
   a memory array coupled to at least one of the plurality of destination circuit blocks; and
   a plurality of logic block circuits coupled to the input bus for receiving one or more of the input signals, each of the logic block circuits being coupled to at least one of lie destination blocks via a first set of interconnect buses, the logic block circuits being placed along the one side of the die such that the first set of interconnect buses extend substantially orthogonal to the input bus,
   wherein the integrated circuit is a dynamic random access memory.

2. The integrated circuit of claim 1 further comprising a plurality of input buffers coupled to the input bus for providing the input signals on the input bus.

3. The integrated circuit of claim 2 wherein a second set of interconnect buses couple the input buffers to the input bus, and a third set of interconnect buses couple the input bus to the logic block circuits, the second and third sets of interconnect buses extending substantially orthogonal to the input bus.

4. The integrated circuit of claim 1 wherein the memory array is a dynamic random access memory array.

5. The integrated circuit of claim 2 wherein the input buffers include a latch circuit for latching the input signals.

6. The integrated circuit of claim 5 wherein the input buffers provide the latched input signals on the input bus synchronously with a clock signal.

7. The integrated circuit of claim 2 wherein at least one of the logic block circuits comprises:
   a first circuit configured to store information indicating a mode of operation for the integrated circuit; the first circuit providing one or more signals on the first set of interconnect buses; and
   a tristate buffer configured to transfer at least a predetermined one of the input signals from the input bus to the first circuit when enabled, the predetermined one of the input signals carrying the information indicating a mode of operation for the integrated circuit.

8. The integrated circuit of claim 7 wherein the tristate buffer comprises at least one pass-transistor gate.

9. The integrated circuit of claim 2 wherein the input bus, the input buffers, and the logic block circuits are located along the one side of the integrated circuit, and at least one of the destination circuit blocks is located along another side of the integrated circuit opposite the one side.

10. The integrated circuit of claim 2 wherein the logic circuit blocks and the input buffers are placed in substantially close proximity to the input bus.

11. The integrated circuit of claim 1 wherein the input bus extends across a substantial portion of the length of one side of the integrated circuit.

12. An integrated circuit comprising:
    an input bus;
    a plurality of input buffers configured to provide a first plurality of input signals on the input bus via a first set of interconnect buses;
    a plurality of logic block circuits configured to receive the first plurality of input signals via a second set of interconnect buses; and
    a plurality of destination circuit blocks configured to receive a second plurality of signals generated by the logic blocks via a third set of interconnect buses,
    wherein the input bus extends across a substantial portion of the length of one side of the integrated circuit and the plurality of logic block circuits are placed along the one side of the integrated circuit in substantially close proximity to the input bus such that the third set of interconnect buses extend substantially orthogonal to the input bus, and at least one of the logic block circuits comprises:
       a first circuit configured to store information indicating a mode of operation for the integrated circuit; the first circuit generating at least one of the second plurality of signals; and
    a tristate buffer configured to transfer at least a predetermined one of the first plurality of latched input signals from the input bus to the first circuit when enabled, the predetermined one of the plurality of latched input signals carrying the information indicating a mode of operation for the integrated circuit.

13. An integrated circuit comprising:
    an input bus configured to receive a plurality of input signals, the input bus extending a predetermined length of one side of the integrated circuit;
    a plurality of destination circuit blocks; and
    a plurality of logic block circuits coupled to the input bus for receiving one or more of the input signals, each of the logic block circuits being coupled to at least one of the destination blocks via a first set of interconnect buses, the logic block circuits being placed along the one side of the die such that the first set of interconnect buses extend substantially orthogonal to the input bus,
    wherein the logic circuit blocks include a first and second logic blocks, the second logic circuit block being a duplicate of the first logic circuit block, the first logic circuit block being coupled to a first one of the destination circuit blocks via a fourth interconnect bus and the second logic circuit block being coupled to a second one of the destination circuit blocks via a fifth interconnect bus, the first and second logic circuit blocks being placed along the one side of the integrated circuit such that the fourth and fifth interconnect buses extend substantially orthogonal to the input bus.

14. An integrated circuit comprising:

an input bus;

a plurality of input buffers configured to provide a first plurality of input signals on the input bus via a first set of interconnect buses;

a plurality of logic block circuits configured to receive the first plurality of input signals via a second set of interconnect buses; and a plurality of destination circuit blocks configured to receive a second plurality of signals generated by the logic blocks via a third set of interconnect buses, wherein the input bus extends across a substantial portion of the length of one side of the integrated circuit and the plurality of logic block circuits are placed along the one side of the integrated circuit in substantially close proximity to the input bus such that the third set of interconnect buses extend substantially orthogonal to the input bus, and the input buffers include a latch circuit for latching the first plurality of input signals, the input buffers providing the first plurality of latched input signals on the input bus synchronously with a clock signal.

15. An integrated circuit comprising:

an input bus;

a plurality of input buffers configured to provide a first plurality of input signals on the input bus via a first set of interconnect buses;

a plurality of logic block circuits configured to receive the first plurality of input signs via a second set of interconnect buses, a plurality of destination circuit blocks configured to receive a second plurality of signals generated by the logic blocks via a third set of interconnect buses; and a memory array configured to receive a third plurality of signals from the destination circuit blocks, wherein the input bus extends across a substantial portion of the length of one side of the integrated circuit and the plurality of logic block circuits are placed along the one side of the integrated circuit in substantially close proximity to the input bus such that the third set of interconnect buses extend substantially orthogonal to the input bus, and wherein the integrated circuit is a dynamic random access memory.

16. The integrated circuit of claim 15 wherein the memory array is a dynamic random access memory array.

17. The integrated circuit of claim 15 wherein the input buffers include a latch circuit for latching the first plurality of input signals, the input buffers providing the first plurality of latched input signals on the input bus synchronously with a clock signal.

18. The integrated circuit of claim 15 wherein the first and second set of interconnect buses extend substantially orthogonal to the input bus.

19. A method for placing and routing circuit blocks in an integrated circuit, the method comprising:

placing a plurality of memory arrays;

placing a plurality of destination circuit blocks in predesignated areas of the integrated circuit around each of the plurality of memory arrays;

extending an input bus across one side of the integrated circuit placing a plurality of logic block circuits coupled to the input bus along the one side of the integrated circuit such tat a first set of interconnect buses coupling the logic circuit blocks to the designation circuit blocks extend substantially orthogonal to the input bus, and placing a plurality of latching input buffers coupled to the input bus.

20. The method of claim 19 further comprising:

placing a plurality of input buffers along the one side of the integrated circuit such that a second set of interconnect buses coupling the input buffers to the input bus extend substantially orthogonal to the input bus.

21. The method of claim 20 wherein the logic circuit blocks are coupled to the destination circuit blocks via a third set of interconnect buses extending substantially orthogonal to the input bus.

22. The method of claim 19 wherein at least one of the predesignated areas is located on a side of the integrated circuit opposite the one side.

23. The method of claim 19 further comprising:

duplicating a first one of the logic circuit blocks;

coupling the first one of the logic circuit blocks via a fourth interconnect bus to a first one of the destination circuit blocks;

coupling the duplicated logic circuit block via a fifth interconnect bus to a second one of the destination circuit blocks; and placing the duplicated logic circuit block and the first one of the logic circuit blocks along the one side of the integrated circuit such that the fourth and fifth interconnect buses extend substantially orthogonal to the input bus.

24. The method of claim 23 wherein the first one and second one of the destination circuit blocks are substantially spaced apart.

25. The method of claim 20 wherein the logic circuit blocks and the input buffers are placed in substantially close proximity to the input bus.

26. The integrated circuit of claim 19 wherein the input bus extends across a substantial portion of the length of one side of the integrated circuit.

27. The method of claim 19 wherein the plurality of memory arrays are a plurality of dynamic random access memory arrays.

28. An integrated circuit comprising:

an input bus configured to receive a plurality of input signals, the input bus extending a predetermined length of one side of the integrated circuit;

a plurality of destination circuit blocks;

a plurality of logic block circuits coupled to the input bus for receiving one or more of the input signals, each of the logic block circuits being coupled to at least one of the destination blocks via a first set of interconnect buses, the logic block circuits being placed along the one side of the die such that the first set of interconnect buses extend substantially orthogonal to the input bus; and a plurality of input buffers coupled to the input bus for providing the input signals on the input bus, wherein the input buffers include a latch circuit for latching the input signals.

29. The integrated circuit of claim 28 wherein the input buffers provide the latched input signals on the input bus synchronously with a clock signal.

30. The integrated circuit of claim 28 wherein at least one of the logic block circuits comprises:

a first circuit configured to store information indicating a mode of operation for the integrated circuit; the first circuit providing one or more signals on the first set of interconnect buses; and a tristate buffer configured to transfer at least a predetermined one of the input signals from the input bus to the first circuit when enabled, the predetermined one of the input signal s carrying the information indicating a mode of operation for the integrated circuit.

31. The integrated circuit of claim 30 wherein the tristate buffer comprises at least one pass-transistor gate.

32. The integrated circuit of claim 28 wherein the integrated circuit is a dynamic random access memory and the input buffers are address buffers.

33. An integrated circuit comprising:

an input bus configured to receive a plurality of input signals, the input bus extending a predetermined length of one side of the integrated circuit;

a plurality of destination circuit blocks;

a plurality of logic block circuits coupled to the input bus for receiving one or more of the input signals, each of the logic block circuits being coupled to at least one of the destination blocks via a first set of interconnect buses, the logic block circuits being placed along the one side of the die such that the first set of interconnect buses extend substantially orthogonal to the input bus; and a plurality of input buffers coupled to the input bus for providing the input signals on the input bus, wherein the integrated circuit is a dynamic random access memory and the input buffers are address buffers.

34. The integrated circuit of claim 33 wherein the input buffers include a latch circuit for latching the input signals.

35. The integrated circuit of claim 34 wherein the input buffers provide the latched input signals on the input bus synchronously with a clock signal.

36. An integrated circuit comprising:

an input bus configured to receive a plurality of input signals, the input bus extending a predetermined length of one side of the integrated circuit;

a plurality of destination circuit blocks;

a plurality of logic block circuits coupled to the input bus for receiving one or more of the input signals, each of the logic block circuits being coupled to at least one of the destination blocks via a first set of interconnect buses, the logic block circuits being placed along the one side of the die such that the first set of interconnect buses extend substantially orthogonal to the input bus; and a plurality of input buffers coupled to the input bus for providing the input signals on the input bus, wherein at least one of the logic block circuits comprises:

a first circuit configured to store information indicating a mode of operation for the integrated circuit; the first circuit providing one or more signals on the first set of interconnect buses; and a tristate buffer configured to transfer at least a predetermined one of the input signals from the input bus to the first circuit when enabled, the predetermined one of the input signals carrying the information indicating a mode of operation for the integrated circuit.

37. The integrated circuit of claim 36 wherein the tristate buffer comprises at least one pass-transistor gate.

38. The integrated circuit of claim 36 wherein the input buffers include a latch circuit for latching the input signals.

39. The integrated circuit of claim 38 wherein the input buffers provide the latched input signals on the input bus synchronously with a clock signal.

40. An integrated circuit comprising:

an input bus configured to receive a plurality of input signals, the input bus extending a predetermined length of one side of the integrated circuit;

a plurality of destination circuit blocks;

a plurality of logic block circuits coupled to the input bus for receiving one or more of the input signals, each of the logic block circuits being coupled to at least one of the destination blocks via a first set of interconnect buses, the logic block circuits being placed along the one side of the die such that the first set of interconnect buses extend substantially orthogonal to the input bus; and a plurality of input buffers coupled to the input bus for providing the input signals on the input bus, wherein the input bus, the input buffers, and the logic block circuits are located along the one side of the integrated circuit, and at least one of the destination circuit blocks is located along another side of the integrated circuit opposite the one side, and the at least one of the destination blocks is an input/output circuit block and the logic block circuits include at least one mode register for storing information indicating a mode of operation for the integrated circuit.

41. The integrated circuit of claim 40 wherein the mode register is duplicated, each mode register being located at opposite sides of the one end of the integrated circuit.

42. The integrated circuit of claim 40 wherein the input buffers include a latch circuit for latching the input signals.

43. The integrated circuit of claim 42 wherein the input buffers provide the latched input signals on the input bus synchronously with a clock signal.

* * * * *

UNITED STATES PATENT AND TRADEMARK OFFICE
CERTIFICATE OF CORRECTION

PATENT NO. : 6,496,032 B1
APPLICATION NO. : 09/608674
DATED : December 17, 2002
INVENTOR(S) : Oh Page 1 of 1

It is certified that error appears in the above-identified patent and that said Letters Patent is hereby corrected as shown below:

On the Title Page, Item (73) Assignee: replace "C-Link" with --G-Link--.

In column 7 at line 34, replace "lie" with --the--.

In column 10 at line 1, replace "tat" with --that--.

In column 11 at line 6, replace "signal s" with --signals--.

Signed and Sealed this

Twenty-fifth Day of December, 2007

JON W. DUDAS
*Director of the United States Patent and Trademark Office*